United States Patent [19]

Brooks et al.

[11] Patent Number: 4,867,838
[45] Date of Patent: Sep. 19, 1989

[54] PLANARIZATION THROUGH SILYLATION

[75] Inventors: Garth A. Brooks, Wappingers Falls; Nancy A. Greco, Lagrangeville, both of N.Y.

[73] Assignee: International Business Machines Corporation, Armonk, N.Y.

[21] Appl. No.: 258,367

[22] Filed: Oct. 17, 1988

Related U.S. Application Data

[62] Division of Ser. No. 923,779, Oct. 27, 1986, Pat. No. 4,816,112.

[51] Int. Cl.⁴ .................. B44C 1/22; C03C 15/00; C03C 25/06; B29C 37/00
[52] U.S. Cl. .................. 156/628; 156/643; 156/659.1; 156/904
[58] Field of Search .............. 156/628, 643, 646, 653, 156/656, 657, 659.1, 662, 904; 252/79.1; 204/192.32, 192.35, 192.37; 427/38, 39

[56] References Cited

U.S. PATENT DOCUMENTS

| 4,004,044 | 1/1977 | Franco et al. | 427/43 |
| 4,025,411 | 5/1977 | Hom-Ma et al. | 204/192 |
| 4,541,168 | 9/1985 | Galie et al. | 29/579 |
| 4,541,169 | 9/1985 | Bartush | 29/591 |
| 4,552,833 | 11/1985 | Ito et al. | 430/325 |
| 4,613,398 | 9/1986 | Chiong et al. | 156/628 |
| 4,615,782 | 10/1986 | Namatsu et al. | 204/192 |
| 4,642,163 | 2/1987 | Greschner et al. | 156/643 |
| 4,676,868 | 6/1987 | Riley et al. | 156/643 |
| 4,702,792 | 10/1987 | Chow et al. | 156/628 |
| 4,723,978 | 2/1988 | Clodgo et al. | 65/31 |
| 4,751,170 | 6/1988 | Mimura et al. | 156/643 X |
| 4,782,008 | 11/1988 | Babich et al. | 156/643 X |

FOREIGN PATENT DOCUMENTS 0151948 8/1985 European Pat. Off.

OTHER PUBLICATIONS

IBM Technical Disclosure Bulletin, vol. 27, No. 7B, Dec. 1984, pp. 4267-4268.
Journal of Vacuum Science & Technology B, vol. 3, No. 5, Sep./Oct. 1985 pp. 1352-1356, Woodbury, N.Y., U.S.: A. D. Butherus et al.: "02 Plasma-Converted Spin-on-Glass for Planarization".
IBM Technical Disclosure Bulletin vol. 28, No. 5, Oct. 1985, p. 1907.
Solid State Technology, vol. 27, No. 4, Apr. 1981, pp. 178-181, Port Washington, N.Y., U.S.: A. C. Adams: "Plasma Planarization".
IBM TDB vol. 23, No. 9, Feb. 1981, p. 4140, "Dual Dielectric for Multilevel Metal" by T. A. Bartush.
European Search Report for Application No. EP87 112330.

Primary Examiner—William A. Powell
Attorney, Agent, or Firm—T. Rao Coca; Jeffrey L. Brandt

[57] ABSTRACT

Disclosed is a process for forming a planarized multilevel ship wiring structure. Starting from a substrate having thereon at least a metal stud serving as vertical wiring between two levels of metallization, a quartz layer is deposited, obtaining a non-planar structure. A thick planarizing photoactive photoresist is applied. The photoresist is converted by silylation process into a silicate having substantially the same etch rate as that of quartz. Silylation is accomplished by, for example, subjecting to resist to a bath of hexamethyldisilazane, hexamethylcyclotrisilazane, octamethylcyclotetrasilazane, N,N,dimethylaminotrimethylsilane or N,N,diethylaminotrimethylsilane, for a period of time determined by the thickness of the resist. Unwanted portions of the silylated resist and quartz are etched back at 1:1 etch rate ratio to the level of the stud.

12 Claims, 2 Drawing Sheets

PLANARIZATION THROUGH SILYLATION

This is a division of application Ser. No. 923,779, filed Oct. 27, 1986, U.S. Pat. No. 4,816,112.

BACKGROUND OF THE INVENTION

The invention relates to a process for planarizing a nonplanar surface and, more particularly, to a process for forming a planarized multilevel chip wiring structure.

A semiconductor chip consists of an array of semiconductor devices whose contacts are interconnected by metal patterns. The metal patterns, or nets, are sometimes multi-layered and separated by an insulating material, like quartz. The thickness of the insulator is made sufficiently large to minimize capacitance between the different levels of wiring and also to render the insulator more tolerant to particulate defects. Connections between nets are made by via studs (also known as vertical wires) which penetrate the insulator. The vertical wire is formed by metal lift-off process described, for example, in U.S. Pat. No. 4,004,044 issued to Franco et al and assigned to the present assignee. The vertical wire is put in place before the insulator is deposited. Using reactive ion etching (RIE) or ion milling, the surface of the insulator is planarized and the top of the stud is exposed. Planarization is necessary since it improves the reliability of subsequent wiring levels as these wires do not have to traverse topography.

The prior art has attempted to planarize the insulator. In one approach, described in IBM Technical Disclosure Bulletin, Vol. 23, No. 9, p. 4140, Feb. 1981 entitled "Dual Dielectric For Multilevel Metal", after forming the metallization pattern in a substrate, planar quartz of a thickness equal to the metal thickness is deposited, and coated with a planarizing resist layer. The resist and quartz are etched back to expose the surface of the metal lines Vertical wiring is then formed on the metal lines, after incorporating a silicon nitride insulator, by lift-off process. Finally, a second layer of quartz or polyimide is deposited, planarized, and etched back to expose the studs.

U.S. Pat. No. 4,541,169 issued to Bartush and assigned to the present assignee discloses a planarization process in the context of making studs at different levels in a chip. After forming the metal studs on first level metal wiring, silicon dioxide layer is deposited and planarized, by etching using a thick photoresist planarization layer, to expose the most elevated studs. A silicon nitride layer is then deposited and using the same mask pattern used to delineate the studs, the nitride (and the residual oxide over the depressed studs) is etched to expose all the studs.

U.S. Pat. No. 4,541,168 issued to Galie et al and assigned to the present assignee discloses a method for making metal contact studs between first level metal and regions of a semiconductor device with the studs butting against polyimide-filled trenches. The metal studs are formed by lift-off followed by sputter depositing silicon dioxide layer of thickness about the stud height, obtaining a nonplanar oxide structure. A planarizing photoresist is applied and the resist and oxide are etched to expose the studs.

A basic problem with these prior art methods is peak inversion. To explain, reference is made to FIGS. 1 and 2 wherein a semiconductor substrate 10 having two metal studs 12 and 14 of different width is illustrated. When an insulator, such as oxide, layer 16 is deposited over the studed structure, peaks 18 and mesas 20 of oxide will be formed over the narrow and wide studs 12 and 14, respectively. Upon applying a planarizing resist layer 22 and etching to expose the studs, due to the higher etch rate of oxide relative to the resist (etch rate ratio of quartz to resist is, typically, about 1.4:1.0) once the oxide peaks and mesas are exposed, these oxide structures tend to etch off more quickly than the remainder of the oxide (which is still protected by the resist 22 thereover). As a result, the peaks and mesas of the oxide are inverted as illustrated in FIG. 2. The resulting structure will be of nonplanar topography consisting of an oxide medium 16 having studs 12 and 14 and vias 24 and 26. Such topography is undesirable as it leads to breakage of the next level wiring metal that is subsequently formed owing to the steepness of the vias in the oxide. Also, the wiring is prone to be fractured due to the sharp edges of the studs, leading to a low device yield and/or reliability. Yet another problem is poor step coverage at the edges of the studs, which, due to electromigration, poses reliability concerns. Thus, it is imperative to obtain a planar surface to have high device yield and reliability.

It would appear that one way of avoiding peak inversion is to obtain 1:1 etch rate ratio of the oxide to photoresist by drying or heating the photoresist as disclosed in U.S. Pat. No. 4,025,411 issued to Hom-Ma et al. However, solidification of the resist by heat treatment does not, in practice, render the etch rate of resist fully compatible with that of the interlevel insulator, particularly when the insulator is other than oxide. Another attempted solution to the above etch rate disparity between resist and oxide is to select he etching conditions (of RIE or ion milling), etchant systems, etc., which would obtain a etch rate ratio. However, the process window which would provide such 1:1 etch rate ratio is extremely limited and difficult to control, rendering this approach unsuitable for a high volume manufacturing environment.

Accordingly, it is the principal object of the invention to provide a process by which the etch rate ratio of interlevel insulator material to the planarizing medium is consistently and reliably rendered 1:1.

SUMMARY OF THE INVENTION

In its broadest form, the invention is a process for planarizing a nonplanar surface. Starting with a substrate having a nonplanar insulator (e.g. a silicate such as $SiO_2$) surface, to render the insulator surface planar, a planarizing photoactive photoresist medium is applied. The photoresist is spin coated followed by soft baking at a sufficiently low temperature to drive out the solvent therein while maintaining the photoactivity of the resist. The dried, photoactive resist is then silylated to convert it into a material having the same etch rate as that of the underlying insulator. The conversion is accomplished by subjecting the dried resist to a silylation bath consisting of a silylating agent which can substitute SiO groups into photoactive compound in the resist. The silylating agent could be an organosilane or organosilazane. Specific examples of these agents are hexamethylcyclotrisilazane, octamethylcyclotetrasilazane, hexamethyldisilazane, N,N,dimethyl aminotrimethylsilane and N,N,diethylaminotrimethylsilane. The silyation process step is accomplished at a temperature in the range 40°–80° C. for a period determined by the scale of 1 minute per thousand Angstroms thickness of the planarizing photoresist. Once the silyation process is complete, the resist is rendered harder and converted to SiO, while maintaining its planar surface. The resulting structure is subjected to an etching step, typically, $CF_4+O_2$ RIE or ion milling Since the etch rate of the silylated resist is the same as that of the insulator, upon etching down to the level of the lowest valley in the insulator, the surface of insulator is made perfectly planar.

In a narrow form, the invention is a process for forming a planarized multilevel chip wiring structure. Starting from a substrate having thereon at least one metal stud serving as vertical wiring between two levels of metallization, an insulator (e.g., quartz) layer is deposited, obtaining a nonplanar structure. A thick planarizing photoactive photoresist is applied. The photoresist is converted by silylation to SiO material having an etch rate quite comparable to that of the quartz, while preserving its surface planarity. Unwanted portions of the silylated resist and quartz are uniformly etched back to expose the stud.

DETAILED DESCRIPTION OF THE PREFERRED EMBODIMENT

Figure 1:
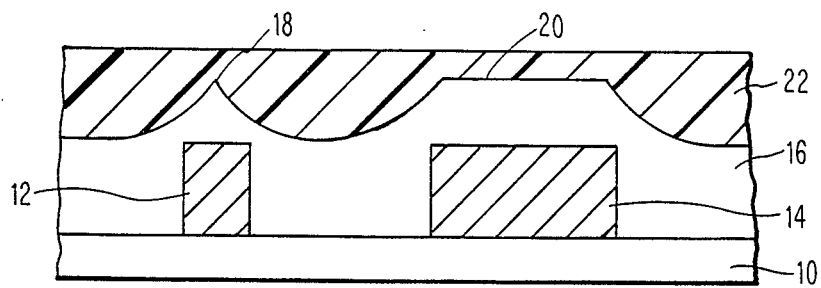
FIGS. 1 and 2 show in cross-sectional representation successive views of a semiconductor structure having vertical wiring, pointing out the problems of the prior art planarization processes.
Figure 2:
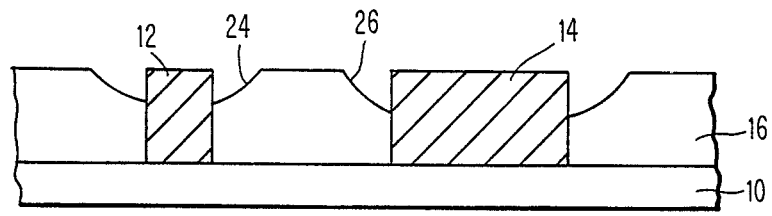

In accordance with the present method, which will be explained with reference to FIGS. 3-5, starting with a semiconductor substrate 30, vertical wiring or studs designated by numerals 32 and 34 are formed by conventional process. The width of the vertical wiring varies, typically, from about 0.5 micron to 8 microns. The vertical wiring may be, for example, in contact with elements of a semiconductor device (not shown) formed on the substrate 10. Alternatively, the studs 32 and 34 may be formed on selected localized regions of a first level metal pattern (not shown) formed on the substrate. Next, the structure is covered with a layer 36 of a silicate material (i.e., a material having the SiO group) such as siloxane or silicon dioxide (quartz). $SiO_2$ may be sputtered according to standard sputtering technique. Due to conformality of layer 36, a mesa 38 and peak 40 of oxide is formed over the wide and narrow studs 32 and 34, respectively.

Figure 3:
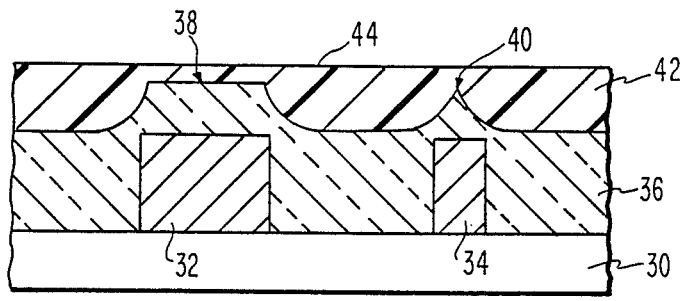
FIGS. 3-5 are cross-sectional representations of a studed semiconductor structure undergoing the planarization process according to the present invention.
Figure 4:
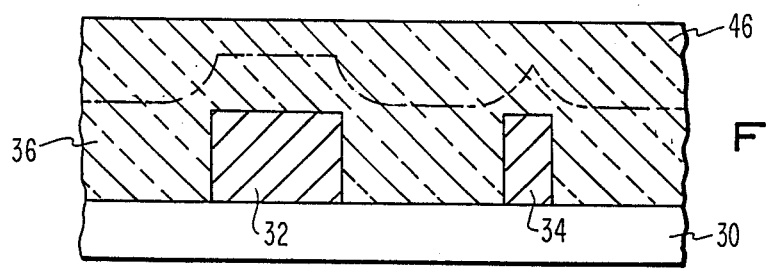

After forming the insulator layer 36 and obtaining a nonplanar surface, a photoactive photosensitive layer 42 is applied, as indicated in FIG. 3 to planarize the structure. An example of the layer material 42 is photoactive photoresist. The thickness of the photoresist layer 42 is typically about 1-2.5 microns, the actual thickness being determined by the height of the peak 40. The higher the peak height, the thicker is the photoresist to obtain planar photoresist surface 44. The photoresist is typically spin-coated, followed by soft-baking at a sufficiently low temperature to drive out the solvents therein, while maintaining the photoactivity of the photoresist. It is important to maintain the photoactive characteristic of the photoresist 42 (i.e., preserve the photoactive bonds in the resist) for the successful implementation of the next crucial process step. Soft-baking of the resist 42 is accomplished at a temperature in the range of 80°-100° C.

After driving out the solvents in the resist 42, the next process step is converting the resist into a material having substantially the same RIE or ion milling rate as the insulator 36. This is achieved by silylating the resist 42. Silylation is accomplished by subjecting the resist layer 42 to a silylation bath consisting of a silylating agent such as an organosilazane or organosilane. Examples of organosilazane are hexamethylcyclotrisilazane (HMCTS), hexamethyldisilazane (HMDS) and octamethylcyclotetrasilazane (OMCTS). Examples of organosilanes are N,N,dimethylaminotrimethylsilane (TMSDMA) and N,N, diethylaminotrimethylsilane (TMSDEA). A chemical reaction occurs in which bonds are broken and SiO groups are substituted into the photoactive compound in the photoresist 42. The silylation process step is accomplished at a temperature of about 40°-80° C. Temperatures higher than 80° C. may not be suitable since then the resist 42 may begin to strip. The silylation is carried out for a period of time determined by the scale of 1 minute per thousand Angstroms thickness of the resist 42. In other words, for a 10,100 A thick resist, silylation is complete in about 10 mins.

The direct result of the silylation process step is that the resist layer 42 is not only rendered harder, but, more importantly, converted to SiO layer 46, while maintaining the planar surface 44 of the resist. In other words, the resist is converted into a material having the same etch rate as that of the quartz material 36. Since the silylated resist is virtually indistinguishable, from etching viewpoint, the previous composite layer of oxide 36 and resist 42 (FIG. 3) is transformed into a single layer of a silicate as indicated in FIG. 4.

Figure 5:
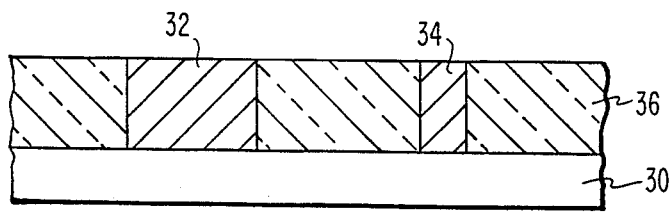

Upon etching back the combination silicate layer 36-46, typically using a $CF_4+O_2$ plasma or ion milling, the top surfaces of the studs 32 and 34 are exposed and the surface of the insulator layer 36 that remains will be coplanar with the exposed stud surfaces (as indicated in FIG. 5).

Figure 6:
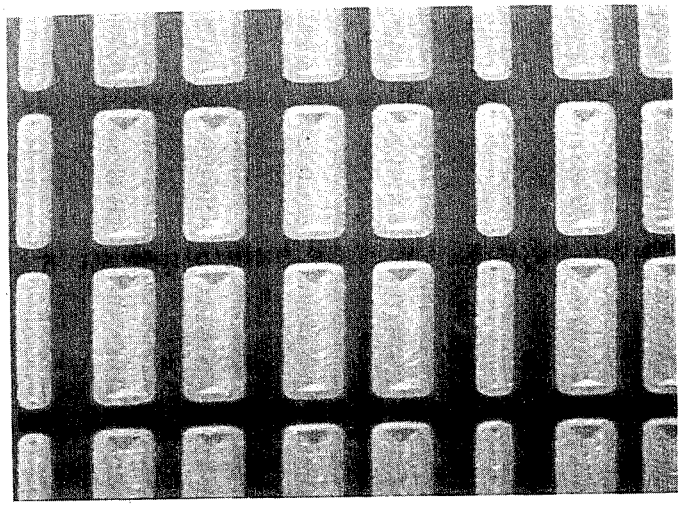
FIG. 6 is a magnified photograph of a vertical wiring structure suffering from quartz peak inversion, characteristic of the prior art.
Figure 7:
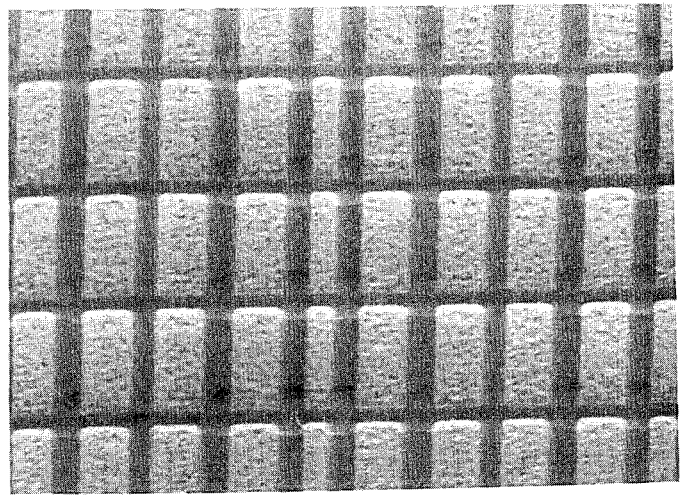
FIG. 7 is a magnified photograph of a vertical wiring structure made in accordance with the present invention, without the occurrence of quartz peak inversion

That the planar structure resulting from the present process is free of peak inversion is dramatically displayed in FIG. 7 which is a photograph in a view taken from the top of a silicon substrate having a number of metal studs embedded in a planar quartz layer. As seen from FIG. 7, the quartz is coplanar with all the studs, regardless of their width, and free of via holes around the studs. This improved result of the invention becomes particularly apparent when compared with the silicon substrate displayed in FIG. 6 which was fabricated without the silylation process of the invention, showing vividly the quartz peak inversion.

Thus, there has been described a planarization process which fully satisfies the objects and advantages set forth. While the invention has been described in conjunction with a preferred embodiment, it is evident that many alternatives and variations will be apparent to those skilled in the art in light of the foregoing description. It is, therefore, contemplated that the appended claims will embrace any such alternatives, modifications and variations as fall within the true scope and spirit of the invention.

We claim:

1. A planarizing process comprising:
   providing a substrate having a nonplanar insulator surface;
   coating said surface with a photosensitive layer to obtain a substantially planar surface thereof;
   converting said photosensitive layer by silylation process into a material having an etch rate substantially the same as that of said insulator;
   etching said material and surface portions of said insulator to render said insulator surface substantially planar.

2. The process as in claim 1 wherein said silylation process comprises subjecting said photosensitive layer to either an organosilazane or organosilane.

3. The process as in claim 2 wherein said silylation process is accomplished for a time determined by the scale of about 1 minute per thousand Angstroms thickness of said photosensitive material.

4. The process as in claims 3 wherein said silylation process is carried out at a temperature in the range of about 40°–80° C.

5. The process as in claim 2 further comprising heat treating the photosensitive material to remove solvents therefrom while preserving the photoactivity thereof.

6. The process as in claim 2 wherein said organosilazane is selected from a group consisting of hexamethyldisilazane, hexamethylcyclotrisilazane and octamethylcyclotetrasilazane.

7. The process as in claim 2 wherein said organosilane is selected from a group consisting of N,N,diethylaminotrimethylsilane and N,N,diethylaminotrimethylsilane.

8. The process as in claim 3 wherein said insulator is silicon dioxide.

9. Planarizing process comprising:
   providing a substrate having a nonplanar insulator surface;
   coating said substrate with a silylatable material to obtain a substantially planar surface thereof;
   converting said silylatable material by silylation into an other material having an etch rate substantially the same as that of said insulator; and
   etching said other material and surface portions of said insulator to render said insulator surface substantially planar.

10. The process as recited in claim 9 wherein said silylatable material is photosensitive.

11. The process as recited in claim 10 wherein said photosensitive material is photoresist.

12. The process as recited in claim 11 wherein said silylation comprises subjecting said photoresist to either an organo-silazane or organosilane.

* * * * *